(12) United States Patent
Kawaguchi

(10) Patent No.: US 11,094,847 B2
(45) Date of Patent: Aug. 17, 2021

(54) LIGHT-EMITTING DEVICE HAVING GAP PORTION BETWEEN PORTION OF INSULATING FILM AND SIDE SURFACE OF LIGHT-EMITTING LAYER

(71) Applicant: NICHIA CORPORATION, Anan (JP)

(72) Inventor: Hirofumi Kawaguchi, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 16/425,855

(22) Filed: May 29, 2019

(65) Prior Publication Data
US 2019/0378955 A1 Dec. 12, 2019

(30) Foreign Application Priority Data
Jun. 8, 2018 (JP) .............................. JP2018-109977

(51) Int. Cl.
*H01L 33/00* (2010.01)
*H01L 33/32* (2010.01)
*H01L 33/24* (2010.01)

(52) U.S. Cl.
CPC .......... *H01L 33/32* (2013.01); *H01L 33/0075* (2013.01); *H01L 33/24* (2013.01); *H01L 2933/0016* (2013.01)

(58) Field of Classification Search
CPC ............. H01L 33/44; H01L 2933/0025; H01L 2933/005
See application file for complete search history.

(56) References Cited

U.S. PATENT DOCUMENTS

| 8,513,682 | B2* | 8/2013 | Wegleiter | H01L 51/5284 |
| | | | | 257/91 |
| 9,337,175 | B2* | 5/2016 | Seo | H01L 33/22 |
| 2008/0211416 | A1* | 9/2008 | Negley | H01L 25/0756 |
| | | | | 315/193 |
| 2012/0193652 | A1* | 8/2012 | Horng | H01L 25/0753 |
| | | | | 257/88 |
| 2013/0049050 | A1 | 2/2013 | Weng | |

FOREIGN PATENT DOCUMENTS

| JP | 2006-210824 A | 8/2006 |
| JP | 2010-205793 A | 9/2010 |
| JP | 2011-138820 A | 7/2011 |
| JP | 2011-165799 A | 8/2011 |
| JP | 2013-045846 A | 3/2013 |
| JP | 2013-239471 A | 11/2013 |
| JP | 2015-035510 A | 2/2015 |
| JP | 2017-135348 A | 8/2017 |

* cited by examiner

*Primary Examiner* — Anh D Mai
(74) *Attorney, Agent, or Firm* — Foley & Lardner LLP

(57) ABSTRACT

A light-emitting device includes: a semiconductor stacked body including: an n-type semiconductor layer having an n-side contact surface, a light-emitting layer located on a region of the n-type semiconductor layer surrounding the n-side contact surface in a top-view, and a p-type semiconductor layer provided on the light-emitting layer; an n-side electrode contacting the n-side contact surface; a p-side electrode located on and contacting the p-type semiconductor layer; and an insulating film opposing a side surface of the light-emitting layer; wherein a first gap portion is located between the insulating film and the side surface of the light-emitting layer such that the side surface of the light-emitting layer is exposed at the first gap portion.

10 Claims, 10 Drawing Sheets

LIGHT-EMITTING DEVICE HAVING GAP PORTION BETWEEN PORTION OF INSULATING FILM AND SIDE SURFACE OF LIGHT-EMITTING LAYER

CROSS-REFERENCE TO RELATED APPLICATION

This application is based upon and claims priority to Japanese Patent Application No. 2018-109977, filed on Jun. 8, 2018, the entire contents of which are incorporated herein by reference.

FIELD

This invention described herein relate to a light-emitting device and a method for manufacturing the same.

BACKGROUND

In a light-emitting device that has a semiconductor stacked body including an n-type semiconductor layer, a light-emitting layer, and a p-type semiconductor layer, a structure in which the light is extracted from the n-type semiconductor layer side which is the surface (the light extraction surface) on the side opposite to the surface where the light-emitting layer and the p-type semiconductor layer are stacked is known. In such a light-emitting device, it is desirable to increase the light extraction efficiency by efficiently reflecting the light emitted from the side surface of the light-emitting layer toward the light extraction surface side.

SUMMARY

According to an embodiment of the invention, a light-emitting device includes a semiconductor stacked body, an n-side electrode, a p-side electrode, and an insulating film. The semiconductor stacked body includes an n-type semiconductor layer, a light-emitting layer, and a p-type semiconductor layer. The n-type semiconductor layer has an n-side contact surface. The light-emitting layer is stacked on a region of the n-type semiconductor layer surrounding the n-side contact surface in a top-view. The p-type semiconductor layer is provided on the light-emitting layer. The n-side electrode contacts the n-side contact surface. The p-side electrode is provided on the p-type semiconductor layer and contacts the p-type semiconductor layer. The insulating film opposes a side surface of the light-emitting layer. A first gap portion is provided between the insulating film and the side surface of the light-emitting layer. The side surface of the light-emitting layer is exposed at the first gap portion.

DETAILED DESCRIPTION

Figure 1:
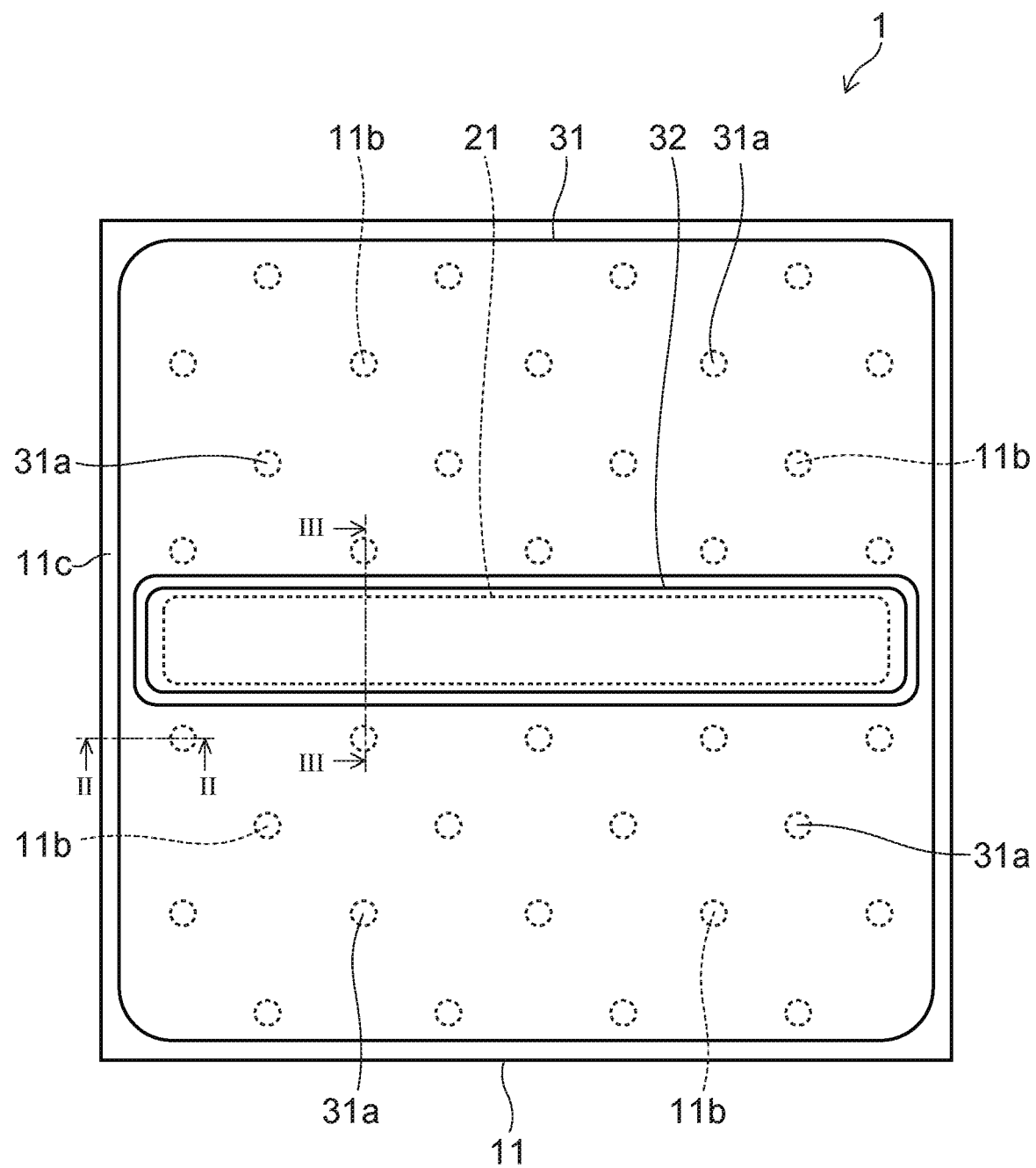
FIG. 1 is a schematic top view of a light-emitting device of an embodiment of the invention.

Embodiments will now be described with reference to the drawings. The same components in the drawings are marked with the same reference numerals.

A light-emitting device 1 includes a substrate 100, and a semiconductor stacked body 10 provided on the substrate 100. The semiconductor stacked body 10 includes an n-type semiconductor layer 11 provided on the substrate 100, a light-emitting layer 12 provided on the n-type semiconductor layer 11, and a p-type semiconductor layer 13 provided on the light-emitting layer 12.

The substrate 100 is transmissive to light emitted by the light-emitting layer 12. The semiconductor stacked body 10 can be epitaxially grown on the substrate 100. For example, sapphire, spinel ($MgAl_2O_4$), silicon carbide (SiC), silicon, GaN, etc., are examples of the material of the substrate 100. In the case in which a nitride semiconductor is grown as the semiconductor stacked body 10, it is favorable for the substrate 100 to be made of GaN, sapphire, or silicon.

It is favorable for the semiconductor stacked body 10 to include, for example, a nitride semiconductor such as $In_xAl_yGa_{1-x-y}N$ ($0 \leq X$, $0 \leq Y$, and $X+Y<1$), etc.

The n-type semiconductor layer 11 has a light extraction surface 11a, an n-side contact surface 11b, and an outer perimeter surface 11c. The n-side contact surface 11b and the outer perimeter surface 11c of the n-type semiconductor layer 11 are provided on the side opposite to the light extraction surface 11a.

The light extraction surface 11a is positioned at the interface between the n-type semiconductor layer 11 and the substrate 100. The light that travels from the light extraction surface 11a toward the substrate 100 side passes through the substrate 100 and is extracted mainly from the side surface of the substrate 100.

The light-emitting layer 12 and the p-type semiconductor layer 13 are not provided on the n-side contact surface 11b and the outer perimeter surface 11c of the n-type semiconductor layer 11. The light-emitting layer 12 and the p-type semiconductor layer 13 are provided on a region of the surface of the n-type semiconductor layer 11 on the side opposite to the light extraction surface 11a other than the n-side contact surface 11b and the outer perimeter surface 11c of the n-type semiconductor layer 11.

For example, the n-side contact surface 11b and the outer perimeter surface 11c of the n-type semiconductor layer 11 are formed by epitaxially growing the n-type semiconductor layer 11, the light-emitting layer 12, and the p-type semiconductor layer 13 in order on the substrate 100 and subsequently etching to remove a portion of the stacked portion of the p-type semiconductor layer 13 and the light-emitting layer 12. The p-type semiconductor layer 13 and the light-emitting layer 12 that are provided on the n-type semiconductor layer 11 remain in a mesa-shaped configuration.

For example, multiple n-side contact surfaces 11b that have circular configurations in the top-view shown in FIG. 1 are provided in the surface of the n-type semiconductor layer 11 on the side opposite to the light extraction surface 11a. When the light-emitting device 1 is viewed in top-view, the light-emitting layer 12 and the p-type semiconductor layer 13 are provided to surround the n-side contact surface 11b.

A p-side electrode 21 is provided on the p-type semiconductor layer 13. The p-side electrode 21 contacts the upper surface of the p-type semiconductor layer 13. The p-side electrode 21 may include a single-layer film or a multilayer film of metals such as Ag, Ni, Ti, Pt, Ta, Ru, etc., or alloys made of these metals. The p-side electrode 21 includes, for example, a Ag film, a Ni film, a Ti film, and a Pt film provided in order from the p-type semiconductor layer 13 interface side.

A first insulating film 41 and a second insulating film 42 are provided on the p-type semiconductor layer 13. The first insulating film 41 covers the p-side electrode 21. The first insulating film 41 is, for example, a silicon nitride film and/or a silicon oxide film. In the case in which the p-side electrode 21 includes Ag, the first insulating film 41 has the effect of preventing migration of, for example, the Ag included in the p-side electrode 21.

The second insulating film 42 covers the first insulating film 41. The second insulating film 42 also covers the upper surface of the p-type semiconductor layer 13.

A third insulating film 43 is provided on the second insulating film 42. The third insulating film 43 covers the second insulating film 42. The second insulating film 42 and the third insulating film 43 are, for example, aluminum oxide films including $Al_2O_3$.

The third insulating film 43 is provided on a mesa-shaped portion 15 which is the portion where the light-emitting layer 12 and the p-type semiconductor layer 13 are stacked. A portion 43a of the third insulating film 43 extends from the region above the mesa-shaped portion 15 to a region opposing the side surface of the mesa-shaped portion 15.

Figure 2:
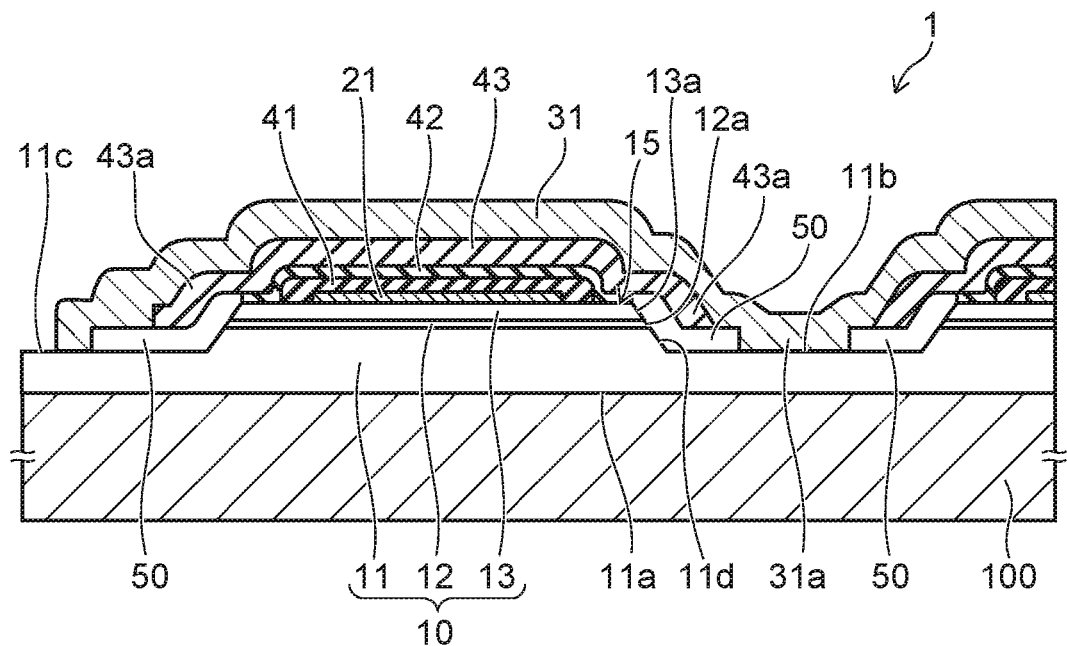
FIG. 2 is a II-II cross-sectional view of FIG. 1.
Figure 3:
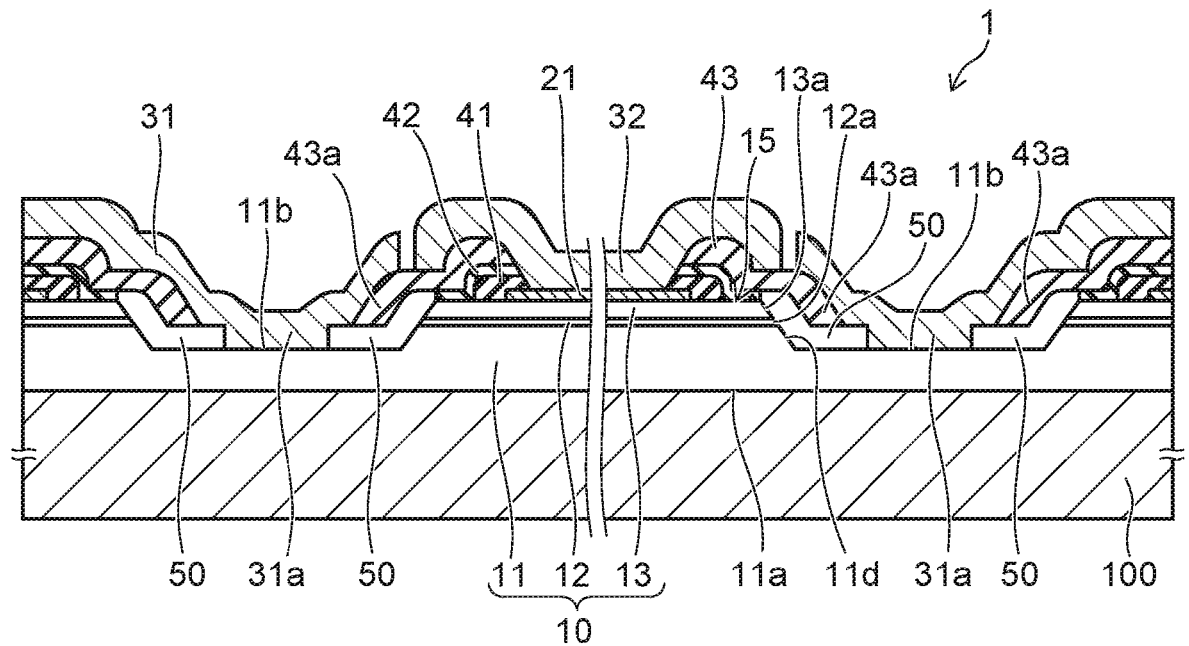
FIG. 3 is a III-III cross-sectional view of FIG. 1.

In the cross-sections shown in FIG. 2 and FIG. 3, the mesa-shaped portion 15 is formed in a trapezoidal configuration. The side surface of the mesa-shaped portion 15 includes a side surface 13a of the p-type semiconductor layer 13, a side surface 12a of the light-emitting layer 12, and a side surface 11d of the n-type semiconductor layer 11. The side surface 13a of the p-type semiconductor layer 13 is formed to be continuous with the upper surface of the p-type semiconductor layer 13. The n-side contact surface 11b of the n-type semiconductor layer 11 and the outer perimeter surface 11c of the n-type semiconductor layer 11 are formed to be continuous with the side surface 11d of the n-type semiconductor layer 11.

The portion 43a of the third insulating film 43 opposes the side surface of the mesa-shaped portion 15 via a gap portion 50. On the outer perimeter surface 11c side, the portion 43a of the third insulating film 43 is formed along the side surface of the mesa-shaped portion 15 and the outer perimeter surface 11c and opposes the outer perimeter surface 11c of the n-type semiconductor layer 11.

The gap portion 50 is provided between the portion 43a of the third insulating film 43 and the side surface of the mesa-shaped portion 15. The side surface of the mesa-shaped portion 15, which includes the side surface 13a of the p-type semiconductor layer 13, the side surface 12a of the light-emitting layer 12, and the side surface 11d of the n-type semiconductor layer 11, is exposed at the gap portion 50.

The gap portion 50 is formed along the side surface of the mesa-shaped portion 15 and a portion of the n-side contact surface 11b. The portion of the n-side contact surface 11b also is exposed at the gap portion 50. The portion of the gap portion 50 opposing the side surface of the mesa-shaped portion 15 and the portion of the gap portion 50 opposing the portion of the n-side contact surface 11b communicate with each other.

The gap portion 50 is also formed along the side surface of the mesa-shaped portion 15 and a portion of the outer perimeter surface 11c of the n-type semiconductor layer 11. The portion of the outer perimeter surface 11c of the n-type semiconductor layer 11 also is exposed at the gap portion 50. The gap portion 50 is provided between the portion of the outer perimeter surface 11c and the portion 43a of the third insulating film 43. The portion of the gap portion 50 opposing the side surface of the mesa-shaped portion 15 and the portion of the gap portion 50 opposing the portion of the outer perimeter surface 11c communicate with each other.

As shown in FIG. 2, an n-side electrode 31 is provided on the third insulating film 43. The n-side electrode 31 includes an n-contact portion 31a contacting the n-side contact surface 11b. The end of the gap portion 50 formed along the portion of the n-side contact surface 11b from the side surface of the mesa-shaped portion 15 reaches the n-contact portion 31a. The gap portion 50 that opposes the portion of the n-side contact surface 11b surrounds the periphery of the n-contact portion 31a.

A portion of the n-side electrode 31 plugs the end of the gap portion 50 formed along the portion of the outer perimeter surface 11c from the side surface of the mesa-shaped portion 15.

As shown in FIG. 3, an opening is formed in a portion of the first to third insulating films 41 to 43 on the mesa-shaped portion 15. A p-side pad electrode 32 is provided in the opening. The p-side pad electrode 32 contacts the p-side electrode 21. A portion of the p-side pad electrode 32 is provided on the peripheral edge of the opening in the third insulating film 43. The p-side pad electrode 32 and the n-side electrode 31 are provided to be separated from each other and are electrically insulated.

As described below, the n-side electrode 31 and the p-side pad electrode 32 are obtained by patterning the same film of a metal material. The n-side electrode 31 and the p-side pad electrode 32 include, for example, an Al film, a Ti film, a Pt film, and a Au film formed in order from the foundation interface side.

Figure 4:
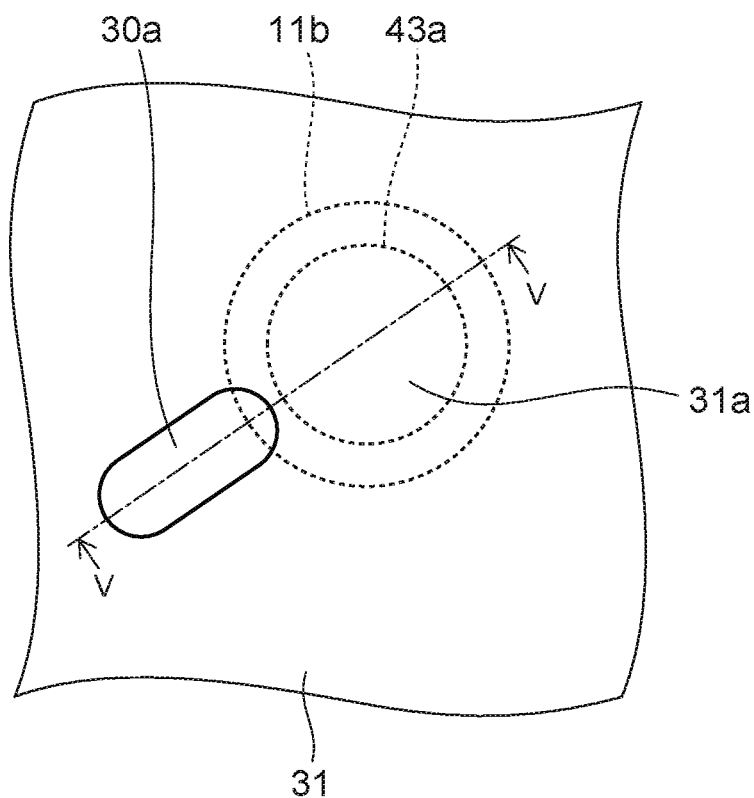
FIG. 4 is an enlarged schematic plan view of a region of the light-emitting device of the embodiment of the invention where an n-contact portion is provided.

FIG. 4 is an enlarged schematic plan view of a region of the light-emitting device 1 of the embodiment where the n-contact portion 31a is provided.

Figure 5:
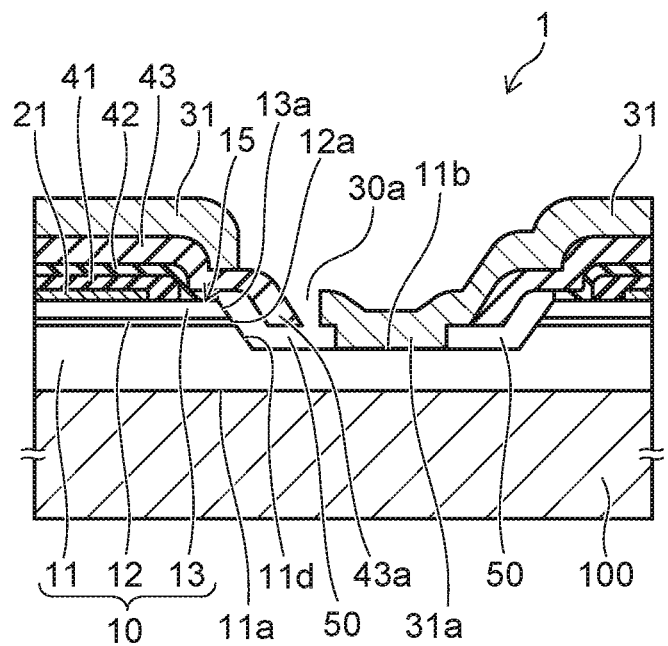
FIG. 5 is a V-V cross-sectional view of FIG. 4.

FIG. 5 is a V-V cross-sectional view of FIG. 4.

As shown in FIG. 5, an opening 30a is formed in a portion of the n-side electrode 31 at the vicinity of the n-contact portion 31a. The opening 30a communicates with the gap portion 50. As described below, a sacrificial film is formed in the portion where the gap portion 50 is to be formed. The third insulating film 43 and an electrode film (a film used to form the n-side electrode 31 and the p-side pad electrode 32) are formed to cover the sacrificial film. The gap portion 50 is formed subsequently by removing the sacrificial film via the opening 30a formed in the portion of the electrode film.

As shown in FIG. 2 and FIG. 3, the cross section of the portion where the n-contact portion 31a is provided on the n-type semiconductor layer 11 is the cross section of the portion where the opening 30a is not formed.

An n-side external connection electrode and a p-side external connection electrode can be provided respectively on the n-side electrode 31 on the mesa-shaped portion 15 shown in FIG. 2 and on the p-side pad electrode 32 shown in FIG. 3.

The external connection electrodes described above are bonded onto pads formed in the wiring substrate where the light-emitting device 1 is mounted via a conductive material such as, for example, solder, etc. In other words, the light-emitting device 1 is mounted to the wiring substrate in a state in which the substrate 100 and the light extraction surface 11a of the n-type semiconductor layer 11 face upward. The substrate 100 may be removed partway through the manufacturing processes.

The light that is emitted from the light-emitting layer 12 is extracted to the outside via the light extraction surface 11a. The greater part of the region on the side opposite to the light extraction surface 11a is covered with metal films (including, for example, Ag and/or Al which have good light reflectivity) including the p-side electrode 21, the n-side electrode 31, and the p-side pad electrode 32. Therefore, the light that is not oriented directly toward the light extraction surface 11a from the light-emitting layer 12 and the light that is reflected at the interface between the n-type semiconductor layer 11 and the substrate 100 can be oriented toward the light extraction surface 11a by being reflected by the metal films.

According to the embodiment, the side surface 12a of the light-emitting layer 12 is not covered with an insulating film and is exposed at the gap portion 50. For example, the semiconductor stacked body 10 that includes the light-emitting layer 12 is $In_xAl_yGa_{1-x-y}N$ (0≤s X, 0≤Y, and X+Y<1) and has a refractive index of about 2.4 to 2.5. The refractive index of the gap portion 50 is 1.0. By utilizing such a refractive index difference between the light-emitting layer 12 and the gap portion 50, the total reflectance at the interface between the gap portion 50 and the side surface 12a of the light-emitting layer 12 can be higher than the total reflectance at the interface between the side surface 12a of the light-emitting layer 12 and the insulating film (e.g., the refractive index of $SiO_2$ being about 1.65, and the refractive index of $Al_2O_3$ being about 1.76).

Accordingly, the light that is emitted from the light-emitting layer 12 toward the interface between the gap portion 50 and the side surface 12a of the light-emitting layer 12 can be reflected efficiently at the interface between the gap portion 50 and the side surface 12a of the light-emitting layer 12 and oriented toward the light extraction surface 11a side. The light extraction efficiency of the light-emitting device 1 can be increased. Also, because the gap portion 50 is disposed at the side surface 12a of the light-emitting layer 12 and a metal member, an insulating member, or the like is not provided at the side surface 12a of the light-emitting layer 12, the light absorption due to the metal member and/or the insulating member can be reduced.

Because the side surface 13a of the p-type semiconductor layer 13 is exposed at the gap portion 50, the total reflectance at the interface between the gap portion 50 and the side surface 13a of the p-type semiconductor layer 13 can be set to be higher than the total reflectance at the interface between the insulating film and the side surface 13a of the p-type semiconductor layer 13. Accordingly, the light that travels toward the interface between the gap portion 50 and the side surface 13a of the p-type semiconductor layer 13 can be reflected efficiently at the interface between the gap portion 50 and the side surface 13a of the p-type semiconductor layer 13 and oriented toward the light extraction surface 11a side. The light extraction efficiency of the light-emitting device 1 can be increased.

Because the side surface 11d of the n-type semiconductor layer 11 is exposed at the gap portion 50, the total reflectance at the interface between the gap portion 50 and the side surface 11d of the n-type semiconductor layer 11 can be set to be higher than the total reflectance at the interface between the insulating film and the side surface 11d of the n-type semiconductor layer 11. Accordingly, the light that travels toward the interface between the gap portion 50 and the side surface 11d of the n-type semiconductor layer 11 can be reflected efficiently at the interface between the gap portion 50 and the side surface 11d of the n-type semiconductor layer 11 and oriented toward the light extraction surface 11a side. The light extraction efficiency of the light-emitting device 1 can be increased.

Because a portion of the n-side contact surface 11b also is exposed at the gap portion 50, the light that propagates through the n-type semiconductor layer 11 toward the n-side contact surface 11b can be reflected efficiently at the interface between the n-side contact surface 11b and the gap portion 50 and oriented toward the light extraction surface 11a side. The light extraction efficiency of the light-emitting device 1 can be increased. The total reflectance at the interface between the n-side contact surface 11b and the gap portion 50 can be set to be higher than the total reflectance at the interface between the n-side contact surface 11b and the insulating film.

Because a portion of the outer perimeter surface 11c of the n-type semiconductor layer 11 also is exposed at the gap portion 50, the light that propagates through the n-type semiconductor layer 11 toward the outer perimeter surface 11c can be reflected efficiently at the interface between the outer perimeter surface 11c and the gap portion 50 and oriented toward the light extraction surface 11a side. The light extraction efficiency of the light-emitting device 1 can be increased. The total reflectance at the interface between the outer perimeter surface 11c and the gap portion 50 can be set to be higher than the total reflectance at the interface between the outer perimeter surface 11c and the insulating film.

In the cross-section shown in FIG. 2 and FIG. 3, the mesa-shaped portion 15 is a trapezoid in which the length of the upper base corresponding to the upper surface where the p-side electrode 21 is provided is shorter than the length of the lower base. The side surface of the mesa-shaped portion 15 has a so-called forward-tapered configuration. Conversely, the side surface of the mesa-shaped portion 15 has a reverse-tapered configuration in the case in which the mesa-shaped portion 15 is an inverted trapezoid in which the length of the upper base corresponding to the upper surface where the p-side electrode 21 is provided is longer than the length of the lower base.

Compared to the mesa-shaped portion 15 that has a side surface having a perpendicular configuration or a reverse-tapered configuration, the light propagates through the semiconductor stacked body 10 toward the side surface of the mesa-shaped portion 15 and is reflected toward the light extraction surface 11a side more easily when the side surface of the mesa-shaped portion 15 has a forward-tapered configuration.

A method for manufacturing the light-emitting device 1 of the embodiment of the invention will now be described with reference to FIG. 6A to FIG. 6M.

Figure 6A:
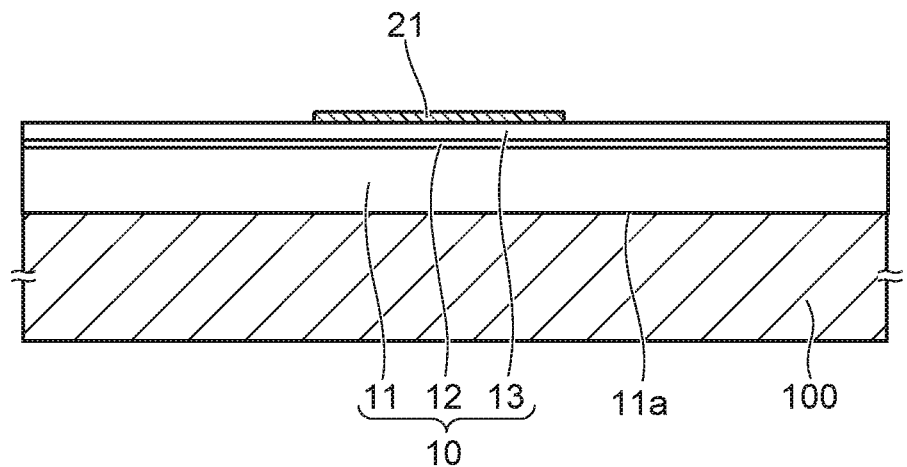
FIG. 6A to FIG. 6M are schematic cross-sectional views showing a method for manufacturing the light-emitting device of the embodiment of the invention.

As shown in FIG. 6A, the semiconductor stacked body 10 that includes the n-type semiconductor layer 11, the light-emitting layer 12, and the p-type semiconductor layer 13 is formed on the substrate 100. For example, the n-type semiconductor layer 11, the light-emitting layer 12, and the p-type semiconductor layer 13 are epitaxially grown in order on the substrate 100.

Figure 6B:
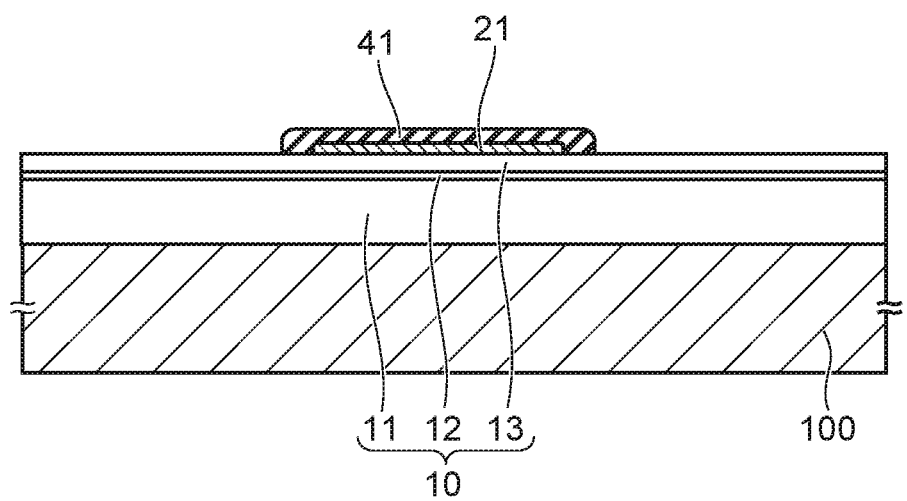

The p-side electrode 21 is formed selectively on the upper surface of the p-type semiconductor layer 13. For example, the p-side electrode 21 is patterned after being formed on the entire surface of the upper surface of the p-type semiconductor layer 13. After forming the p-side electrode 21, the first insulating film 41 is formed on the upper surface of the p-type semiconductor layer 13 to cover the p-side electrode 21 as shown in FIG. 6B. For example, a silicon nitride film is formed as the first insulating film 41 by plasma CVD (Chemical Vapor Deposition).

Figure 6C:
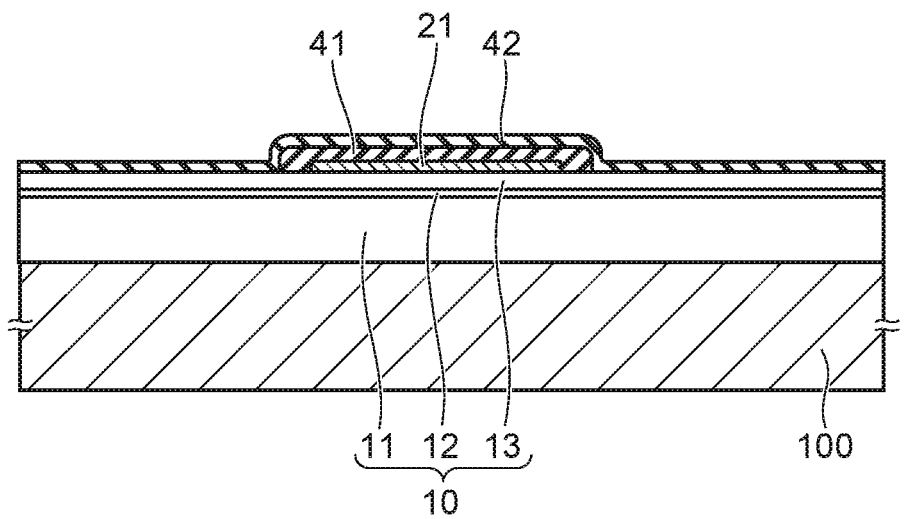

After forming the first insulating film 41, the second insulating film 42 is formed on the upper surface of the p-type semiconductor layer 13 to cover the first insulating film 41 as shown in FIG. 6C. For example, an aluminum oxide film is formed as the second insulating film 42 by sputtering.

Figure 6D:
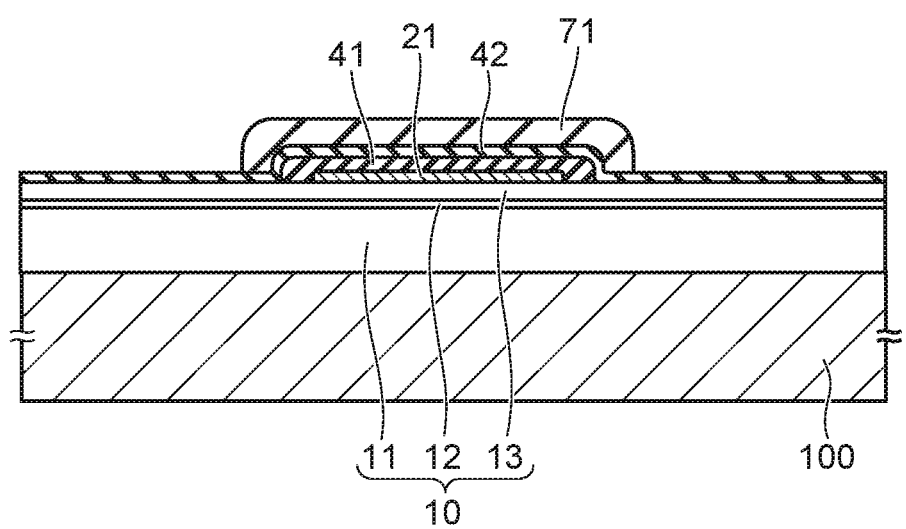

After forming the second insulating film 42, a resist film 71 is formed on the second insulating film 42 as shown in FIG. 6D. The resist film 71 selectively covers the region where the p-side electrode 21 and the first insulating film 41 are formed.

The regions of the second insulating film 42 and the semiconductor stacked body 10 not covered with the resist film 71 are etched by RIE (Reactive Ion Etching) using the resist film 71 as a mask.

Figure 6E:
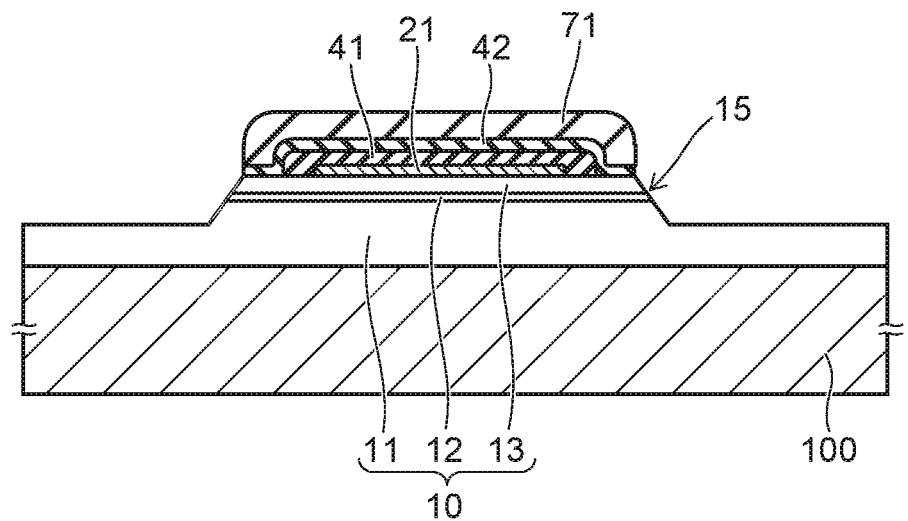

The mesa-shaped portion 15 is formed in the semiconductor stacked body 10 by the RIE as shown in FIG. 6E. The mesa-shaped portion 15 includes the stacked structure of the n-type semiconductor layer 11, the light-emitting layer 12, and the p-type semiconductor layer 13. The region of the semiconductor stacked body 10 other than the mesa-shaped portion 15 is a region where the p-type semiconductor layer 13 and the light-emitting layer 12 are removed and a portion of the n-type semiconductor layer 11 is removed. The surface (the n-type semiconductor surface) of the n-type semiconductor layer 11 is exposed.

Figure 6F:
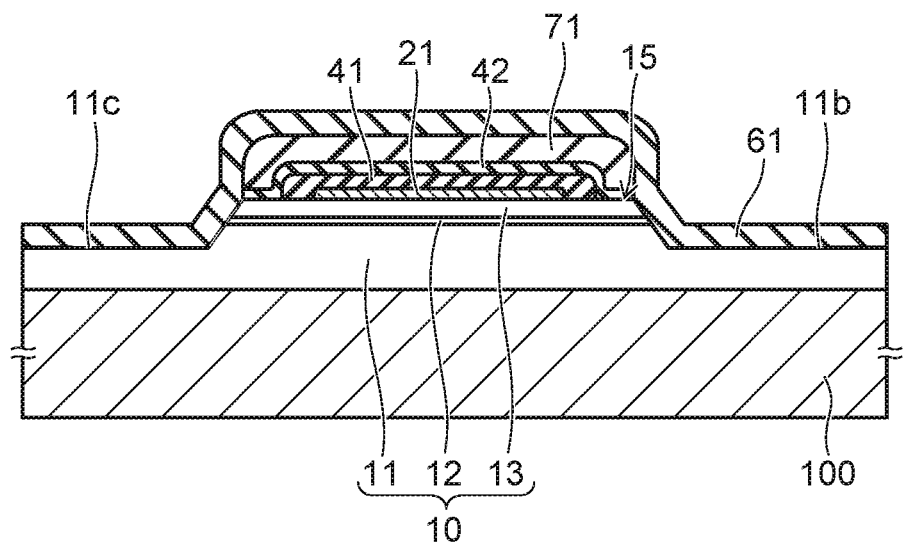

After forming the mesa-shaped portion 15, a sacrificial film 61 is formed to cover the resist film 71 and the exposed portion of the semiconductor stacked body 10 as shown in FIG. 6F. The sacrificial film 61 is, for example, a silicon oxide film including $SiO_2$. The sacrificial film 61 covers the side surface of the mesa-shaped portion 15 and the n-type semiconductor surface (the surface used to form the n-side contact surface 11b and the outer perimeter surface 11c described above).

Figure 6G:
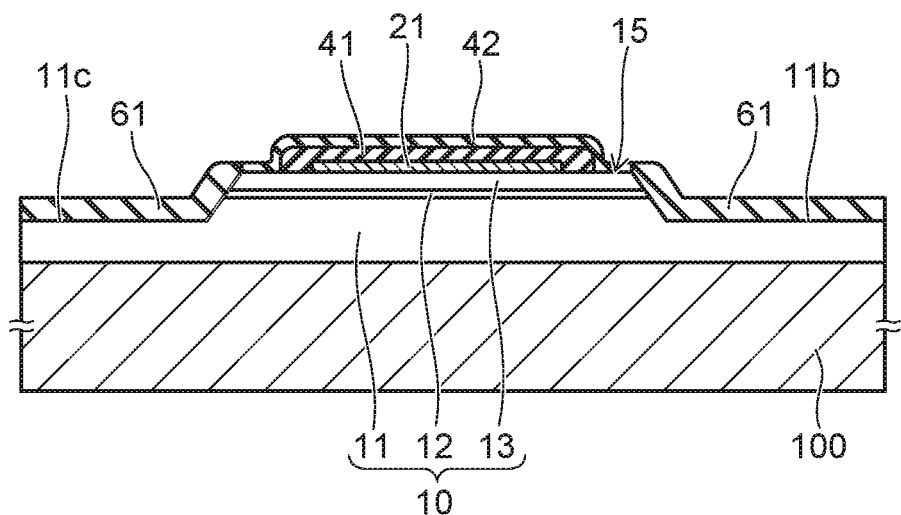

After forming the sacrificial film 61, the resist film 71 is removed by lift-off. The portion of the sacrificial film 61 formed on the resist film 71 also is removed with the resist film 71. As shown in FIG. 6G, the sacrificial film 61 that covers the side surface of the mesa-shaped portion 15, the n-side contact surface 11b, and the outer perimeter surface 11c remains.

Figure 6H:
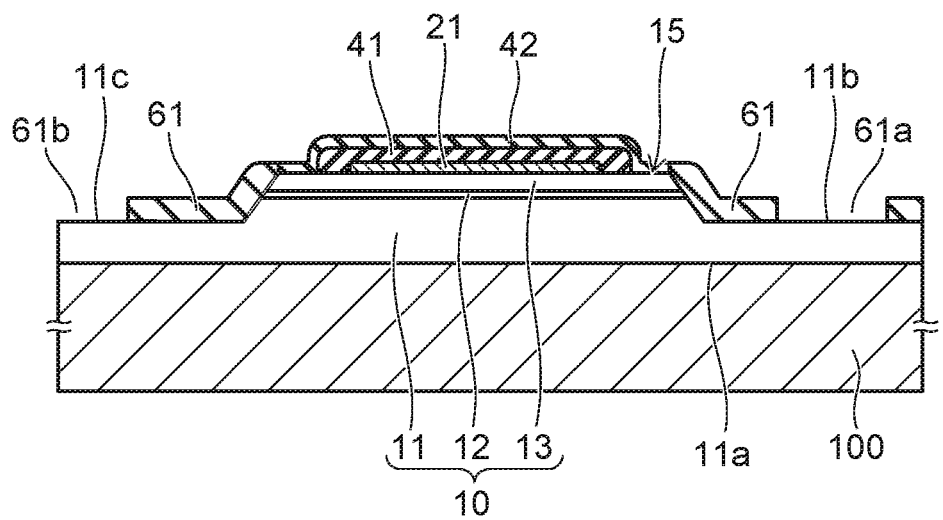

The remaining sacrificial film 61 is patterned. An opening 61a and an opening 61b are formed in the sacrificial film 61 as shown in FIG. 6H. The n-side contact surface 11b is exposed at the opening 61a of the sacrificial film 61. The outer perimeter surface 11c is exposed at the opening 61b of the sacrificial film 61.

Figure 6I:
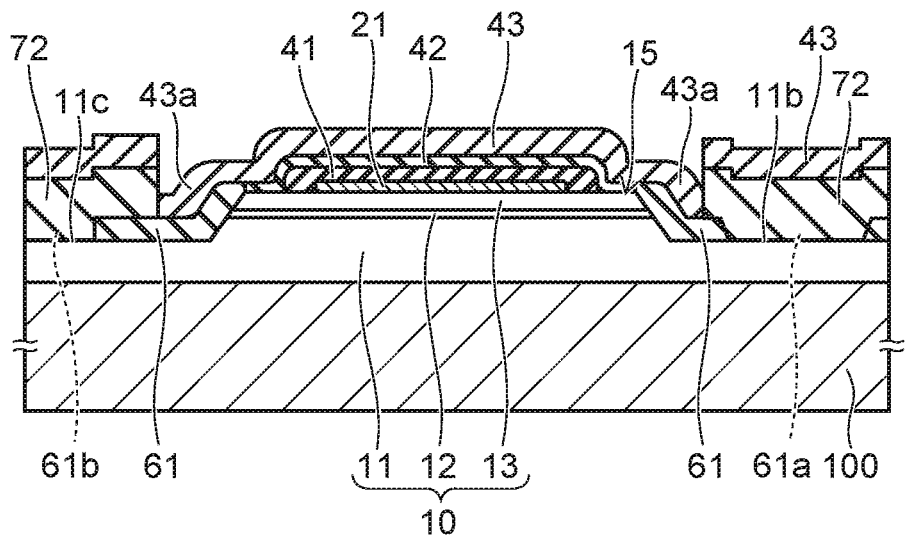
Figure 6J:
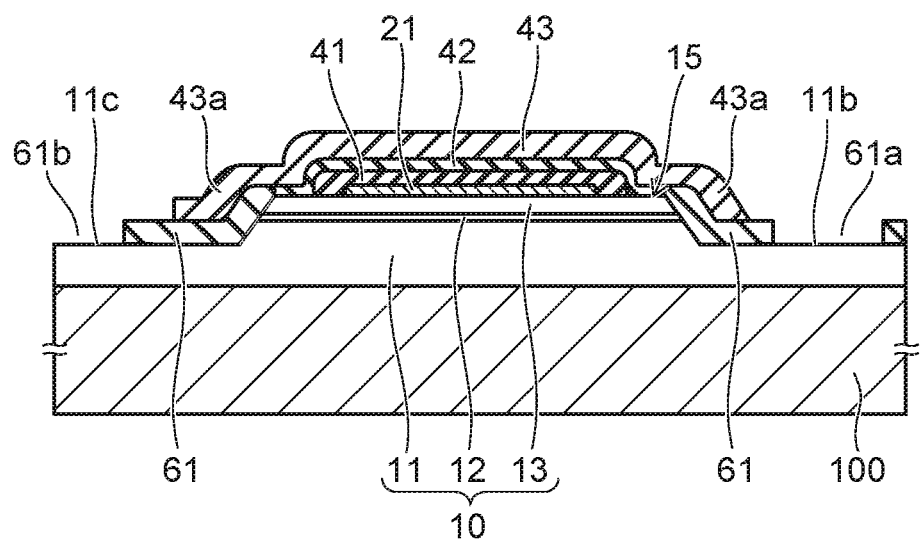

Subsequently, as shown in FIG. 6I, a resist film 72 is formed selectively to cover the opening 61a of the sacrificial film 61 and the opening 61b of the sacrificial film 61. After forming the resist film 72, the third insulating film 43 is formed on the entire surface of the exposed portion. The portion 43a of the third insulating film 43 covers a portion of the surface of the sacrificial film 61. For example, an aluminum oxide film is formed as the third insulating film 43 by sputtering.

Subsequently, the resist film 72 is removed by lift-off. The portion of the third insulating film 43 formed on the resist film 72 also is removed with the resist film 72. The resist film 72 is removed. As shown in FIG. 63, the n-side contact surface 11b is exposed via the opening 61a. The outer perimeter surface 11c is exposed via the opening 61b.

Figure 6K:
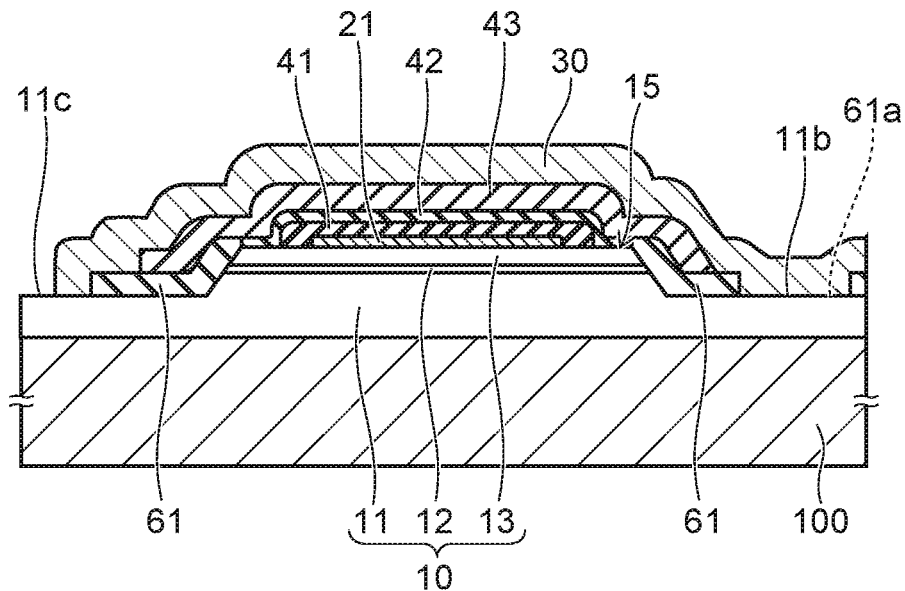

Subsequently, as shown in FIG. 6K, an electrode film 30 is formed on the entire surface of the exposed portion. The electrode film 30 covers the third insulating film 43. The electrode film 30 is also formed inside the opening 61a and contacts the n-side contact surface 11b. The electrode film 30 covers the end portion of the sacrificial film 61 at the periphery of the n-side contact surface 11b. The electrode film 30 is provided also on the outer perimeter surface 11c and covers the end portion of the sacrificial film 61 on the outer perimeter surface 11c.

Before forming the electrode film 30, an opening that reaches the p-side electrode 21 is formed in the third insulating film 43, the second insulating film 42, and the first insulating film 41 as shown in FIG. 3. The electrode film 30 is also formed inside the opening and contacts the p-side electrode 21 as the p-side pad electrode 32.

Figure 6L:
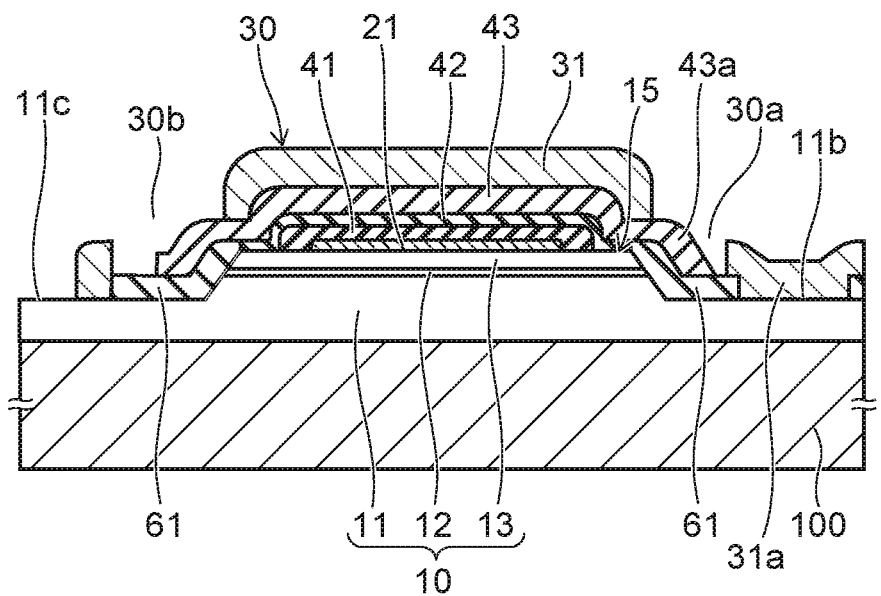

After forming the electrode film 30, the electrode film 30 is divided into the n-side electrode 31 shown in FIG. 2 and the p-side pad electrode 32 shown in FIG. 3. At this time, as shown in FIG. 6L, the opening 30a is formed in a portion of the electrode film 30 at the vicinity of the n-contact portion 31a. An opening 30b is formed in a portion of the electrode film 30 at the vicinity of the outer perimeter surface 11c. The diameters or the widths of the openings 30a and 30b are, for example, about 1 µm.

A portion of the sacrificial film 61 is exposed at the openings 30a and 30b. Then, the sacrificial film 61 is removed by etching via the openings 30a and 30b. For example, the sacrificial film 61 which is a silicon oxide film or a silicon nitride film is removed using a vapor including hydrofluoric acid (HF). The electrode film 30 and the insulating film (e.g., the aluminum oxide film) 43 include materials different from that of the sacrificial film 61 and are resistant to the etching at this time. An aluminum oxide film can be used as the sacrificial film 61 in the case in which the sacrificial film 61 is etched using a vapor including hydrochloric acid (HCl). In such a case, a silicon oxide film and/or a silicon nitride film that has resistance to the etching is used as the third insulating film 43. By performing etching using such a vapor, the etching is performed not only for the sacrificial film 61 exposed at the openings 30a and 30b, but also, for example, for the sacrificial film 61 that is provided to be continuous with the sacrificial film 61 exposed at the openings 30a and 30b. Accordingly, for example, the sacrificial film 61 that is provided as one body on the side surface of the mesa-shaped portion 15 can be etched using the relatively small openings 30a and 30b provided in the electrode film 30.

The multiple openings 30a are formed to correspond to the multiple n-contact portions 31a. At least one opening 30a is formed at the vicinity of each of the n-contact portions 31a.

In the top-view of FIG. 1, the n-type semiconductor layer 11 is formed in a quadrilateral configuration, and the outer perimeter surface 11c is continuous along the four sides of the n-type semiconductor layer 11. The sacrificial film 61 that is formed on the outer perimeter surface 11c also is continuous along the four sides of the n-type semiconductor layer 11. Therefore, by forming the opening 30b in at least one side of the n-type semiconductor layer 11, the sacrificial film 61 that is provided on the outer perimeter surface 11c and on the side surface of the mesa-shaped portion 15 at the vicinity of the outer perimeter surface 11c can be removed via the opening 30b.

By forming the opening 30b at each of the four sides of the n-type semiconductor layer 11, the etching gas (including the vapor) is supplied easily to the entire sacrificial film 61 formed along the four sides, and the sacrificial film 61 can be removed easily in a short period of time.

By causing the portion 43a of the third insulating film 43 to remain at the portion opposing the side surface of the mesa-shaped portion 15, shorts between the n-side electrode 31 and the side surface 13a of the p-type semiconductor layer 13 and shorts between the n-side electrode 31 and the side surface 12a of the light-emitting layer 12 can be prevented reliably.

Figure 6M:
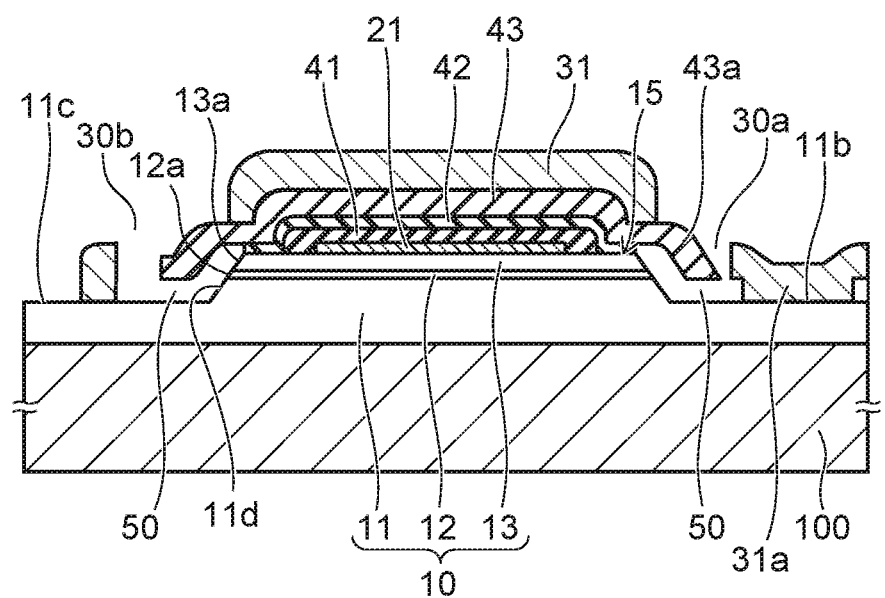

The sacrificial film 61 is removed, and the gap portion 50 is formed in the region where the sacrificial film 61 is provided as shown in FIG. 6M. Thus, by removing the sacrificial film 61, the gap portion 50 that is formed is different from voids, etc., that are undesirably formed unintentionally. The width of the gap portion 50 corresponds to the thickness of the sacrificial film 61 and corresponds to the height in a direction perpendicular to the surface of the n-type semiconductor layer 11 in cross-section. The width of the gap portion 50 is, for example, about 800 nm.

The embodiments of the present invention have been described with reference to specific examples. However, the present invention is not limited to these specific examples. Based on the above-described embodiments of the present invention, all embodiments that can be implemented with appropriately design modification by one skilled in the art are also within the scope of the present invention as long as the gist of the present invention is included. Besides, within the scope of the spirit of the present invention, one skilled in the art can conceive various modifications, and the modifications fall within the scope of the present invention.

What is claimed is:

1. A light-emitting device comprising:
a semiconductor stacked body comprising:
an n-type semiconductor layer having an n-side contact surface and an upper surface,
a light-emitting layer located on the upper surface of the n-type semiconductor layer, the light-emitting layer having an upper surface, a lower surface, and a side surface extending from the upper surface to the lower surface, and
a p-type semiconductor layer provided on the upper surface of the light-emitting layer,
wherein the side surface of the light-emitting layer is exposed from the n-type semiconductor layer and the p-type semiconductor layer;
a p-side electrode located on and contacting the p-type semiconductor layer; and
an insulating film partially covering the p-type semiconductor layer and the light-emitting layer, wherein a first portion of the insulating film opposes the side surface of the light-emitting layer; and
an n-side electrode contacting the n-side contact surface and partially covering the insulating film, such that a second portion of the insulating film is located between the n-side electrode and the p-side electrode in a direction perpendicular to the upper surface of the n-type semiconductor layer;
wherein a first gap portion is located between the first portion of the insulating film and the side surface of the light-emitting layer such that the side surface of the light-emitting layer is exposed at the first gap portion.

2. The device according to claim 1, wherein a second gap portion is located at a portion of the n-side contact surface such that the portion of the n-side contact surface is exposed at the second gap portion.

3. The device according to claim 2, wherein the second gap portion communicates with the first gap portion.

4. The device according to claim 1, wherein:
the n-type semiconductor layer has a side surface where the light-emitting layer and the p-type semiconductor layer are not stacked; and
a third gap portion is located at the side surface of the n-type semiconductor layer such that the side surface of the n-type semiconductor layer is exposed at the third gap portion.

5. The device according to claim 2, wherein:
the n-type semiconductor layer has a side surface where the light-emitting layer and the p-type semiconductor layer are not stacked; and
a third gap portion is located at the side surface of the n-type semiconductor layer such that the side surface of the n-type semiconductor layer is exposed at the third gap portion.

6. The device according to claim 3, wherein:
the n-type semiconductor layer has a side surface where the light-emitting layer and the p-type semiconductor layer are not stacked; and
a third gap portion is located at the side surface of the n-type semiconductor layer such that the side surface of the n-type semiconductor layer is exposed at the third gap portion.

7. The device according to claim 4, wherein the third gap portion communicates with the first gap portion.

8. The device according to claim 5, wherein the third gap portion communicates with the first gap portion.

9. The device according to claim 6, wherein the third gap portion communicates with the first gap portion.

10. The device according to claim 1, wherein:
the n-side electrode covers the first portion of the insulating film.

* * * * *